(12) United States Patent  
Teo et al.

(10) Patent No.: US 8,624,667 B2  
(45) Date of Patent: Jan. 7, 2014

(54) HIGH ELECTRON MOBILITY TRANSISTORS WITH MULTIPLE CHANNELS

(75) Inventors: Koon Hoo Teo, Lexington, MA (US);  
Peijie Feng, Syracuse, NY (US);  
Chunjie Duan, Brookline, MA (US);  
Toshiyuki Oishi, Tokyo (JP);  
Nakayama Masatoshi, Tokyo (JP)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 13/567,749

(22) Filed: Aug. 6, 2012

(65) Prior Publication Data

US 2013/0141156 A1  Jun. 6, 2013

Related U.S. Application Data

(60) Provisional application No. 61/566,791, filed on Dec. 5, 2011.

(51) Int. Cl.  
*H01L 25/00* (2006.01)

(52) U.S. Cl.  
USPC .......................................................... 327/566

(58) Field of Classification Search  
USPC .................. 327/427, 564, 565, 566, 574, 581  
See application file for complete search history.

(56) References Cited

U.S. PATENT DOCUMENTS

| | | | |
|---|---|---|---|
| 7,915,643 B2 * | 3/2011 | Suh et al. ........................ | 257/194 |
| 7,948,011 B2 | 5/2011 | Rajan et al. | |
| 8,193,538 B2 * | 6/2012 | Wort et al. ...................... | 257/77 |
| 2009/0146185 A1 | 6/2009 | Suh et al. | |

* cited by examiner

*Primary Examiner* — Jeffrey Zweizig  
(74) *Attorney, Agent, or Firm* — Dirk Brinkman; Gene Vinokur

(57) ABSTRACT

A device includes a source for transmitting an electronic charge through a conduction path; a drain for receiving the electronic charge; a stack for providing at least part of the conduction path; and a gate operatively connected to the stack for controlling a conduction of the electronic charge. The stack includes an insulator layer, an N-polar layer and a barrier layer selected such that, during an operation of the device, the conduction path formed in the N-polar layer includes a two-dimensional electron gas (2DEG) channel and an inversion carrier channel.

18 Claims, 15 Drawing Sheets

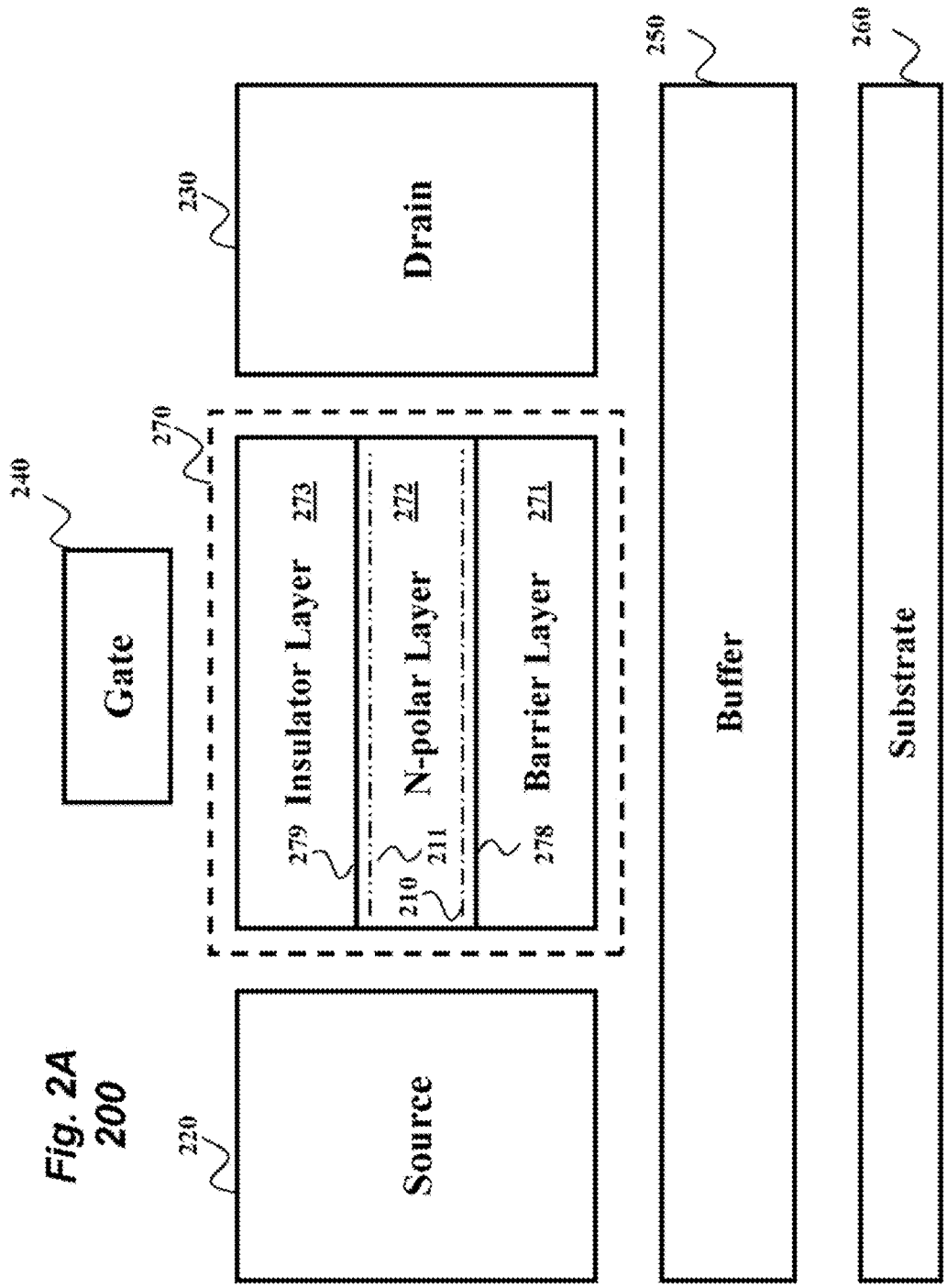

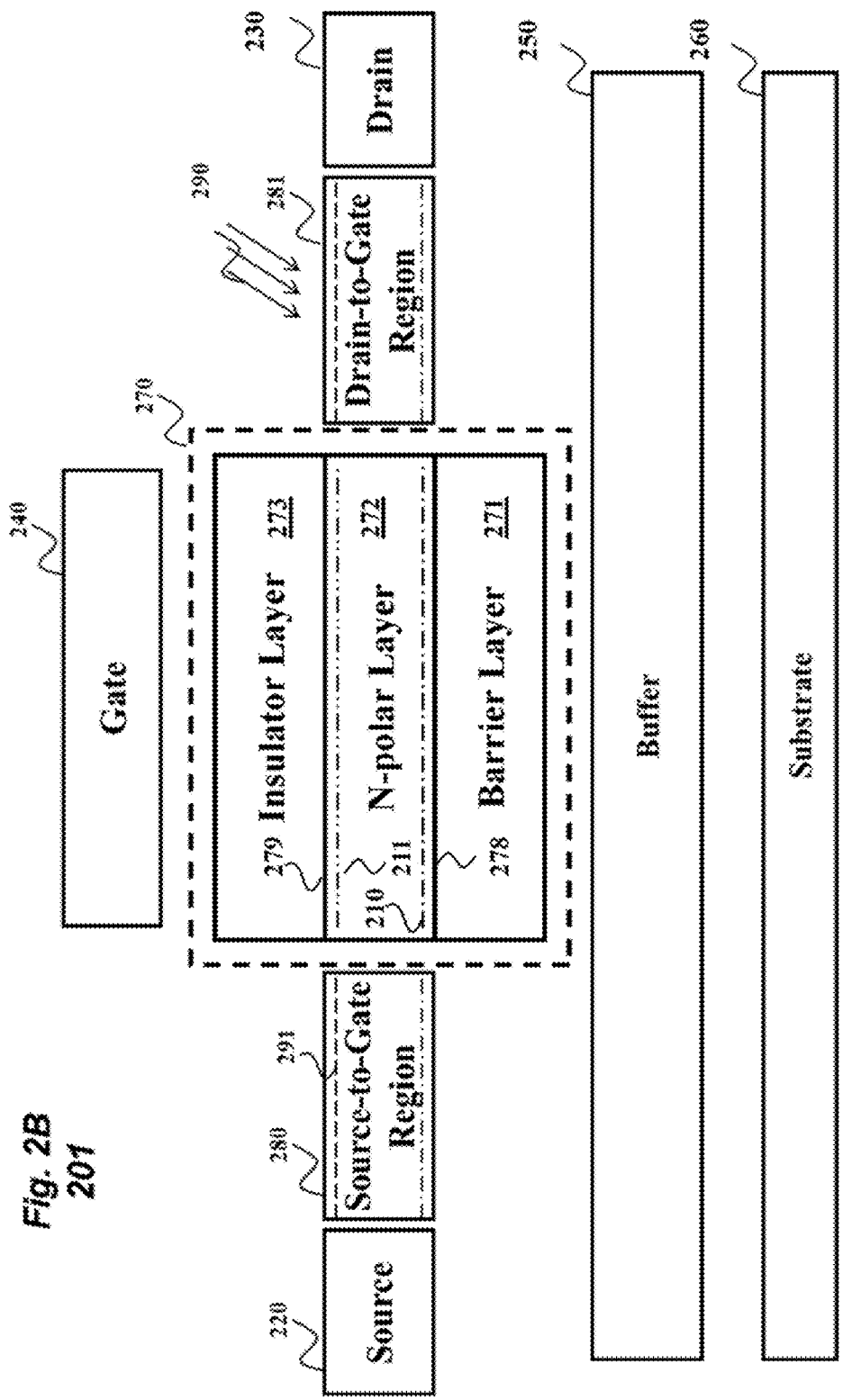

300

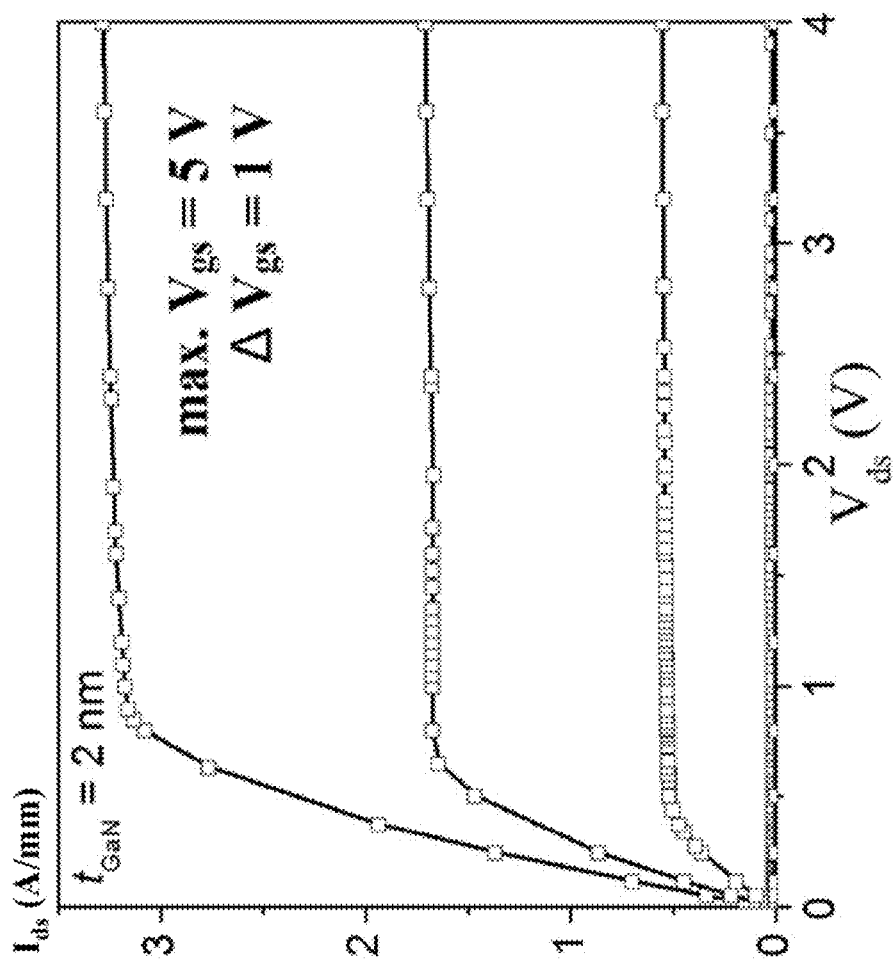

HIGH ELECTRON MOBILITY TRANSISTORS WITH MULTIPLE CHANNELS

RELATED APPLICATION

This application claims priority from a provisional application 61/566,791 entitled, "High Electron Mobility Transistors with Multiple N-Polar GaN Channels," filed Koon Hoo Teo et al. on Dec. 5, 2011.

FIELD OF THE INVENTION

The present invention relates generally to gallium nitride (GaN) based high electron mobility transistors (HEMTs), and more particularly to transistors with multiple conductive channels.

BACKGROUND OF THE INVENTION

High electron mobility transistor (HEMT), also known as heterostructure FET (HFET) or modulation-doped FET (MODFET), is a transistor incorporating a junction between two materials with different band gaps, i.e., a heterojunction, as the channel. The heterojunction can be contrasted with a doped layer that generally used by MOSFET. As used herein, the heterojunction is the interface that occurs between two layers or regions of dissimilar crystalline semiconductors or other materials. A commonly used material combination is GaAs with AlGaAs with the introduction of modulation doping for two-dimensional electron gas (2DEG) generation. Another used material combination is GAN with AlGaN with the introduction of polarization charge for 2DEG generation. The selection of the combination of the materials may vary in dependence on the application.

To allow conduction, semiconductors are doped with impurities, which donate mobile electrons (or holes). However, those electrons are slowed down through collisions with the impurities (dopants) used to generate them in the first place. HEMTs avoid this through the use of high mobility electrons generated using the heterojunction. The heterojunction allows creating a very thin layer of highly mobile conducting electrons with very high concentration, giving the channel very low resistivity, i.e., high electron mobility.

The HEMTs utilizing gallium nitride (GaN) HEMTs have high-power performance. As used herein, GaN materials that are suitable for transistors can include binary, tertiary, or quaternary materials.

FIG. 1 shows an example of a conventional GaN HEMT device, described in e.g., U.S. publication 2009/0146185, which could be designed to have a threshold voltage of −3V. Layer 10 is a substrate, such as of SiC, sapphire, Si, or GaN, layer 11 is a GaN buffer, and layer 12 is AlGaN, with 20% Al composition as an example ($Al_{0.2}Ga_{0.8}N$). Layers 11 and 12 are both Ga-face material. A negative gate voltage is required to deplete the 2DEG under the gate and thereby turn the device off.

The GaN HEMT device can include a III-nitride semiconductor body with at least two III-nitride layers formed thereon. The material which forms III-nitride layer 12, e.g., AlGaN, has a larger bandgap than that which forms buffer layer 11, e.g., GaN. The polarization field that results from the different materials in the adjacent III-nitride layers induces a conductive two dimensional electron gas (2DEG) region near the junction 9 of the two layers, specifically in the layer with the narrower band gap. The 2DEG region or channel is shown throughout the figures as a dashed line. One of the layers through which current is conducted is the channel layer. Herein, the narrower band gap layer in which the current carrying channel, or the 2DEG channel is located is referred to as the channel layer. The device also includes a gate electrode 18 and source and drain electrodes 16, 17 on either side of the gate electrode 18. The region between the gate and drain and the gate and source, which allows for current to be conducted through the device, is the access region 7. The region below the gate electrode 18 is the gate region 6.

The improvements in the design of GaN devices are focusing on single channel Ga-polar GaN based HEMTs. However, the conventional Ga-polar HEMT usually requires advanced process techniques such as the gate-recess structure, the F-treatment or capping, layers in making enhancement-mode (E-mode) device. Those techniques can deplete the 2DEG underneath the gate region but suffer from either controllability issue or lattice damage problem.

An N-polar GaN HEMT device has a reverse polarization field and can be advantageous over Ga-polar device in making single channel E-mode device with low access resistance, and in particular, for low voltage operation, see e.g., U.S. Pat. No. 7,948,011. However, despite the increased performance of the N-polar devices, the drive current under low voltage bias for N-polar GaN HEMT is smaller than the state-of-the-art Ga-polar GaN HEMT. This limitation of the drive current degrades the RF amplification capability and limits the output power density of the device.

Thus, there is a need for improvement in current drivability, output power performance and gate controllability of HEMT devices.

SUMMARY OF THE INVENTION

An objective of present invention is to provide a high electron mobility transistor (HEMT) having enhanced current carrying capability. It is a further object of some embodiments to provide a HEMT device having dual channels conduction path. It is a further object of some embodiments to provide a HEMT operative at low voltage while preserving current can capability.

It is a further object of some embodiments to provide a HEMT with improved breakdown characteristics. It is a further object of some embodiments to reduce an overall thickness of the HEMT, while offering enhanced current carrying capability. It is a further object of some embodiments to simplify a design of such HEMT and to reduce the fabrication complexity. It is a further object of some embodiments to provide a HEMT with E-mode and/or D-mode operations.

Some embodiments of the invention are based on a realization that combination of insulator layer, N-polar Layer and Barrier Layer can be used to create a HEMT having dual channels, i.e., one channel is a two-dimensional electron gas (2DEG) channel formed by N-polar layer and barrier layer due to a heterojunction, and another channel is inversion carrier channel formed by insulator layer and N-polar layer due to capacitive relationship between the gate of HEMT and the N-polar layer. Moreover, it is specifically recognized that formation of such dual channels is possible within one layer, i.e., N-polar layer, without creating interference between the channels.

It is further recognized that it is advantageous to carefully select the thickness of the insulator layer. This is because the thickness should be selected in dependence of a voltage applied to the gate during the operation such that the inversion carrier channel is created. For example, in various embodiments the thickness of the insulator layer is a proportional function of a dielectric constant of a material of the insulator layer or selected such that a minimum voltage sufficient to control the 2DEG channel is also sufficient to create and control the inversion carrier channel. Also, in some embodiments the thickness of the N-polar layer is selected such that the interference between channels is avoided.

Accordingly, one embodiment discloses a device that includes a source for transmitting an electronic charge through a conduction path; a drain for receiving the electronic charge; a stack for providing at least part of the conduction path; and a gate operatively connected to the stack for controlling a conduction of the electronic charge. Thee stack includes an insulator layer, an N-polar layer and a barrier layer selected such that, during an operation of the device, the conduction path formed in the N-polar layer includes a two-dimensional electron gas (2DEG) channel and an inversion carrier channel.

Another embodiment discloses a high electron mobility transistor (HEMT). The HEMT includes a source for transmitting an electronic charge through a conduction path; a drain for receiving the electronic charge; a stack for providing at least part of the conduction path; and a gate operatively connected to the stack for controlling a conduction of the electronic charge. The stack includes an insulator layer, an N-polar layer and a barrier layer selected such that during an operation of the device a two-dimensional electron gas (2DEG) channel is formed by the N-polar layer and the barrier layer due to a heterojunction, and an inversion carrier channel is formed by the insulator layer and N-polar layer due to capacitive relationship between the gate and the N-polar layer.

The HEMT employing the principles of the invention has enhanced current carrying capability, due to dual channels conduction path. Also, such HEMT has a simplified design due to reduction of numbers and thickness of the layers of a stack, which lead to a reduction of the fabrication complexity. Also, the HEMT according to some embodiments of the invention can be operated at low voltage while preserving current carrying capability, because the reduction of the voltage at the gate and the drain is compensated by an additional channel.

Furthermore, in some embodiments, a material of the insulator layer is selected based on a dielectric constant of the material. For example, the material with the high dielectric constant can be selected to increase insulator thickness for breakdown performance improvement while preserving equivalent oxide thickness of the insulator layer for dual channel feasibility.

Some embodiments take advantage of minimizing the thickness of the layers of the stack till optimum thickness avoiding interference between the dual channels. Specifically, the thickness of the N-polar layer can be reduces. Also, the thickness of the insulator layer can be reduced to improve control of the channels while still avoiding the interference. In some embodiments optional polarization layer is used to provide a HEMT with E-mode. Some other embodiments operate in D-mode.

Accordingly, one embodiment discloses a device that includes a source for transmitting an electronic charge through a conduction path; a drain for receiving the electronic charge; a stack for providing at least part of the conduction path; and a gate operatively connected to the stack for controlling a conduction of the electronic charge. The stack includes an insulator layer, an N-polar layer and a barrier layer selected such that, during an operation of the device, the conduction path formed in the N-polar layer includes a two-dimensional electron gas (2DEG) channel and an inversion carrier channel.

Another embodiment discloses a high electron mobility transistor (HEMT), including a source for transmitting an electronic charge through a conduction path; a drain for receiving the electronic charge; a stack for providing at least part of the conduction path; and a gate operatively connected to the stack for controlling a conduction of the electronic charge, wherein the stack includes an insulator layer, an N-polar layer and a barrier layer selected such that during an operation of the device a two-dimensional electron gas (2DEG) channel is formed by the N-polar layer and the barrier layer due to a heterojunction, and an inversion carrier channel is formed by the insulator layer and N-polar layer due to capacitive relationship between the gate and the N-polar layer.

Yet another embodiment discloses a method for transmitting an electronic charge from a source to a drain through a conduction path of a stack. The method includes controlling a conduction of the electronic charge using a gate operatively connected to the stack to form at least part of the conduction path including a two-dimensional electron gas (2DEG) channel and an inversion carrier channel.

BRIEF DESCRIPTION OF THE DRAWINGS

FIG. 2A is a schematic of a symmetrical dual-channel MIS-HEMT according to embodiments of the invention;

FIG. 2B is a schematic of an asymmetrical dual-Channel MIS-HEMT according to embodiments of the invention;

FIGS. 4A-4D and 5A-5F are graphs of operating characteristics of the device according to various embodiments of the invention.

DETAILED DESCRIPTION OF THE PREFERRED EMBODIMENTS

Figure 1:
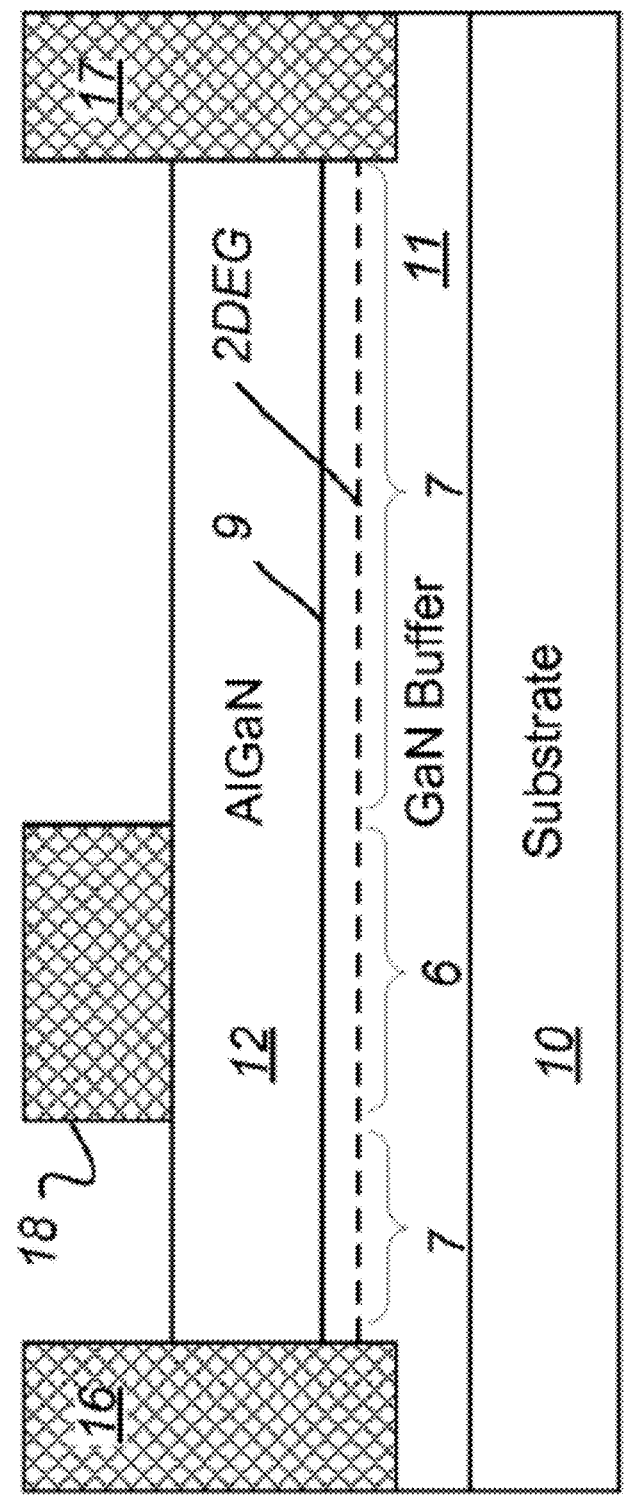
FIG. 1 is a schematic of conventional HEMTs with a single channel.

FIG. 2A shows a schematic of a device 200 designed according to embodiments of the invention. The device 200 can be a high electron mobility transistor (HEMT) device. The device includes a source 220 for transmitting an electronic charge through a conduction path, a drain 230 for receiving the electronic charge, a stack 270 for providing at least part of the conduction path, a gate 240 operatively connected to the stack for controlling a conduction of the electronic charge. The device can also include a buffer 250 and a substrate 260. The stack 270 can be an N-polar stack 270 that includes a barrier layer 271, an N-polar layer 272, and an insulator layer 273 selected such that, during the operation of the device 200, an inversion carrier channel 210 and a two-dimensional electron gas (2DEG) channel 211 are formed in one N-polar layer 272. The channels 210 and 211 formed at least part of the conductive path between the source and the drain.

Some embodiments of the invention are based on a realization that combination of the insulator layer, the N-polar layer and the barrier layer can be used to create the HEMT having dual channels within N-polar layer without creating interference between the channels. The 2DEG channel 211 is formed by N-polar layer and barrier layer due to a hetero unction at an interface 278. The inversion carrier channel 210 is formed by the insulator layer and the N-polar layer due to capacitive relationship between the gate of HEMT and the N-polar layer having a surface interface 279. Accordingly, the HEMT device 200 can enhance current carrying capability, because of the dual-channeling. Also a design of such HEMT can reduce the fabrication complexity due to a single channel layer.

FIG. 2B shows the dual-channel HEMT device 201 according to another embodiments of the invention. In this embodiment, the stack 270 is formed under the gate region 240, and the device 210 further includes a source-to-gate region 280 and a drain-to-gate region 281. Ultra shallow doping 290 is applied to the surface of the regions 280 and 281 to ensure the complete conduction path 291 (including channel 211) from source to drain for surface inversion carrier channel. The diffusion depth of the surface doping can be controlled with a few nanometers to minimize the overlap between the surface inversion carrier channel and the 2DEG channel. The length of the extension regions 280 and 281 can be either symmetrical or asymmetrical. Increase of the length of the drain-to-gate region can reduce the leakage current and alleviate the peak electrical field at the drain side of the gate edge to improve device breakdown performance.

Figure 5A:
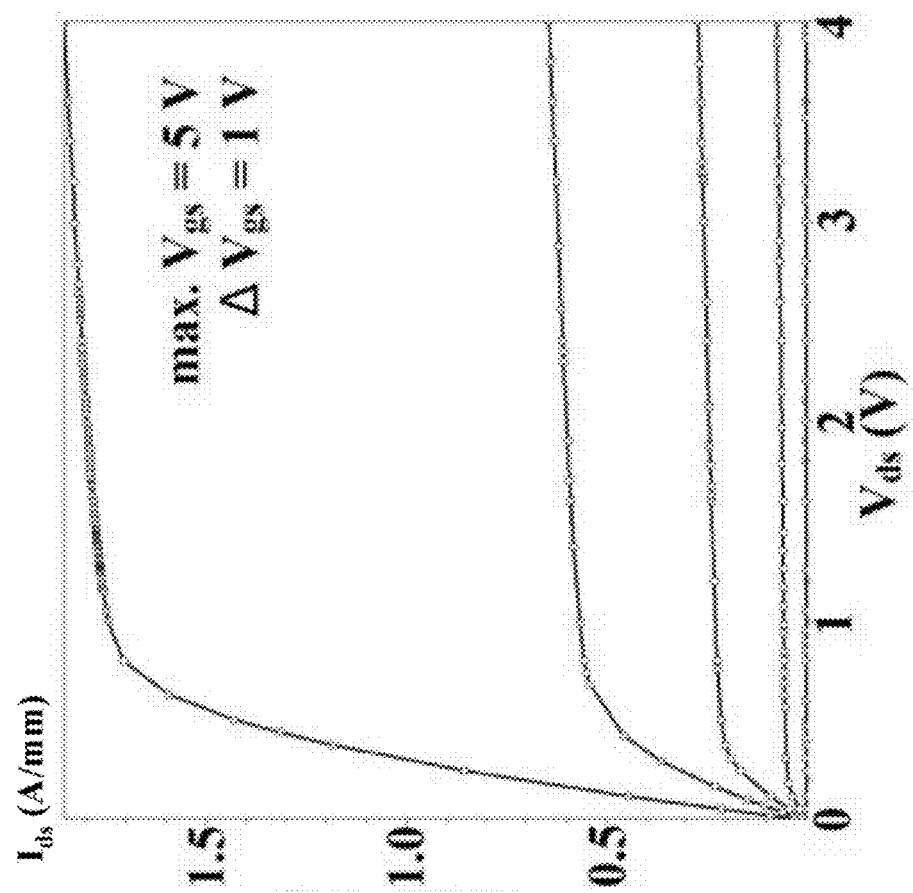
Figure 5B:
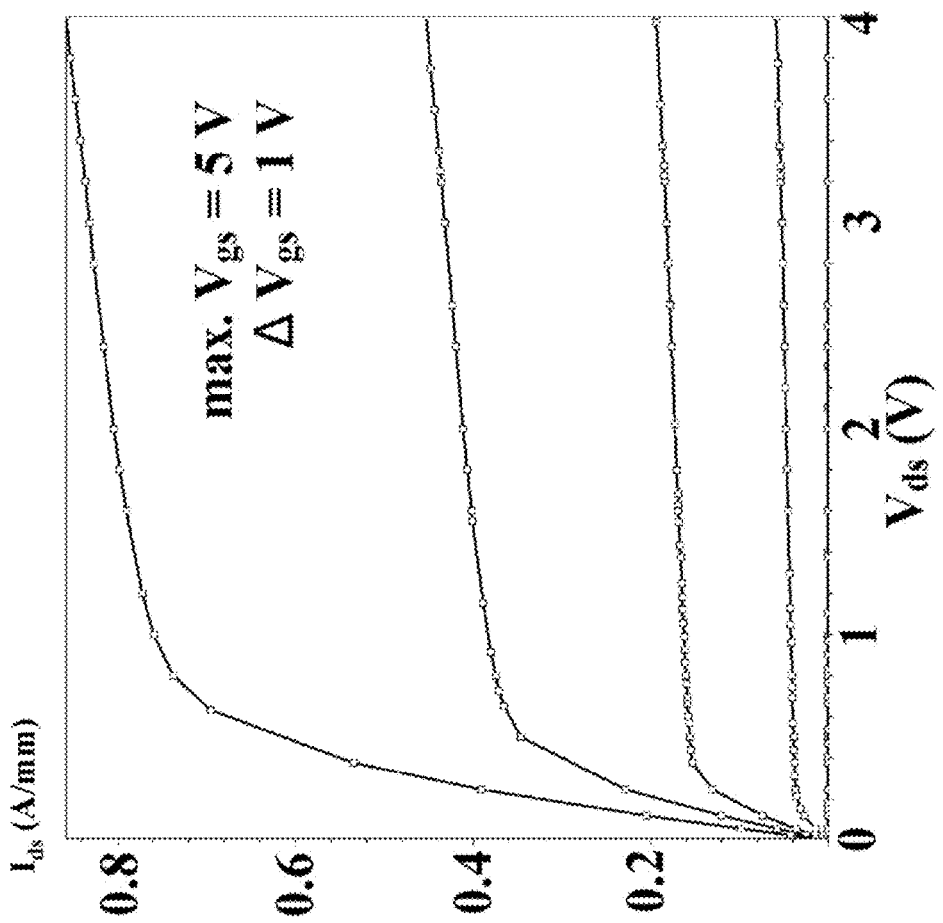
Figure 5C:
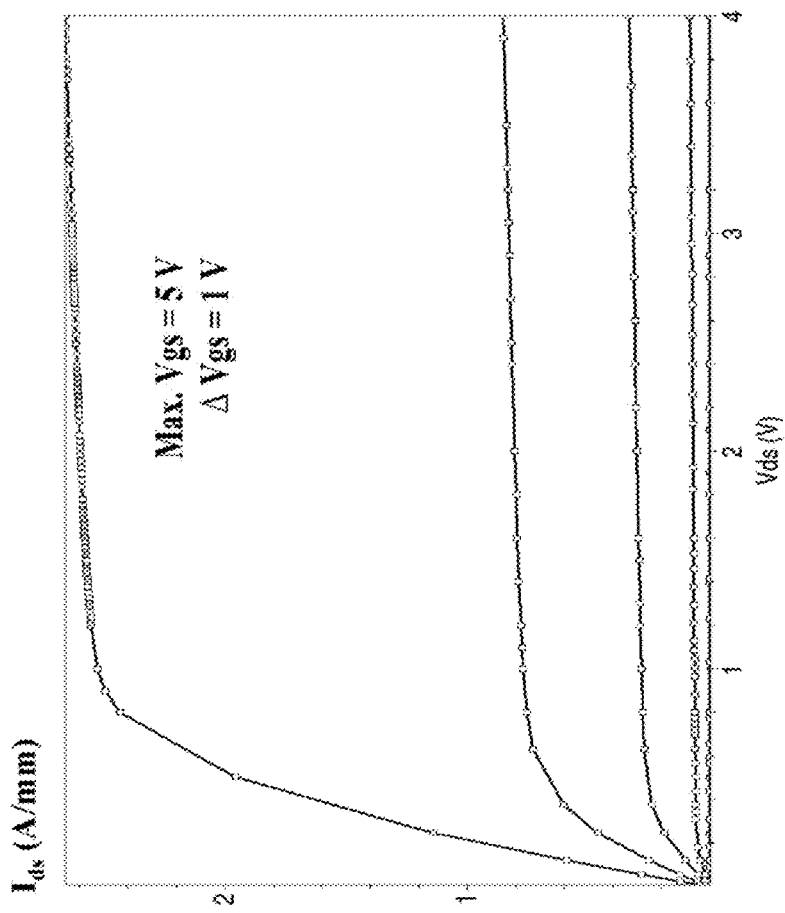

FIGS. 5A-C are graphs further illustrating the advantages of the dual channel HEMT over a single channel HEMT device. For example, as shown in FIG. 5A, one advantage lies in the boost of the drive current. Under low voltage bias (Vgs=5 V and Vds=4 V), the maximum normalized drain current of dual channel readies about 1.83 A/mm, which is almost twice of the single channel device maximum current carrying capability under the same bias condition, as shown in FIG. 5B. The increase of the drive current is contributed by the surface inversion carrier channel in N-polar GaN layer.

The further increase of the drain current can be achieved by improving current carrying capability of either the surface inversion carrier channel component or the bottom 2DEG sheet channel component, or both of them.

For example, the current drivability of the surface inversion carrier channel is related to condition of the interface, the electron density and the carrier confinement. The interface condition can be improved by molecular beam epitaxy (MBE) growth of the epi-layers to minimize the defects during the fabrication. The electron density can be increased by strengthening the electrical field at the surface interface 279.

Because the inversion carrier channel 210 is separated from the 2DEG channel 211, the confinement of each channel minimizes the reduction in electronic carrier mobility. The inversion channel current component enhancement can also be done by further thinning the gate insulator layer 273. Small thickness of the insulator enhance the gate control on the N-polar layer 272 surface condition with a higher inversion carrier density and improve the device short channel effects. As shown in FIG. 5C, output characteristics shows a dual channel HEMT with 2 nm AlN and 0.5 nm SiN, has a 1.74× drive current as the previous dual channel one, and 3.86× drive current as the single channel one under the same bias condition.

The 2DEG current conductivity can be increased by using wide bandgap polarized material with heavy doping for the barrier layer. The wide bandgap polarized material is expected to generate larger net polarization different that induces more 2DEG close to the interface 278. The 2DEG mobility can be enhanced by improving the interface condition between the N-polar layer 272 and the barrier layer 271. Therefore, in one embodiment, the thickness and quality of those layers are controlled to assure the epitaxial growth of such a structure.

Figure 5D:
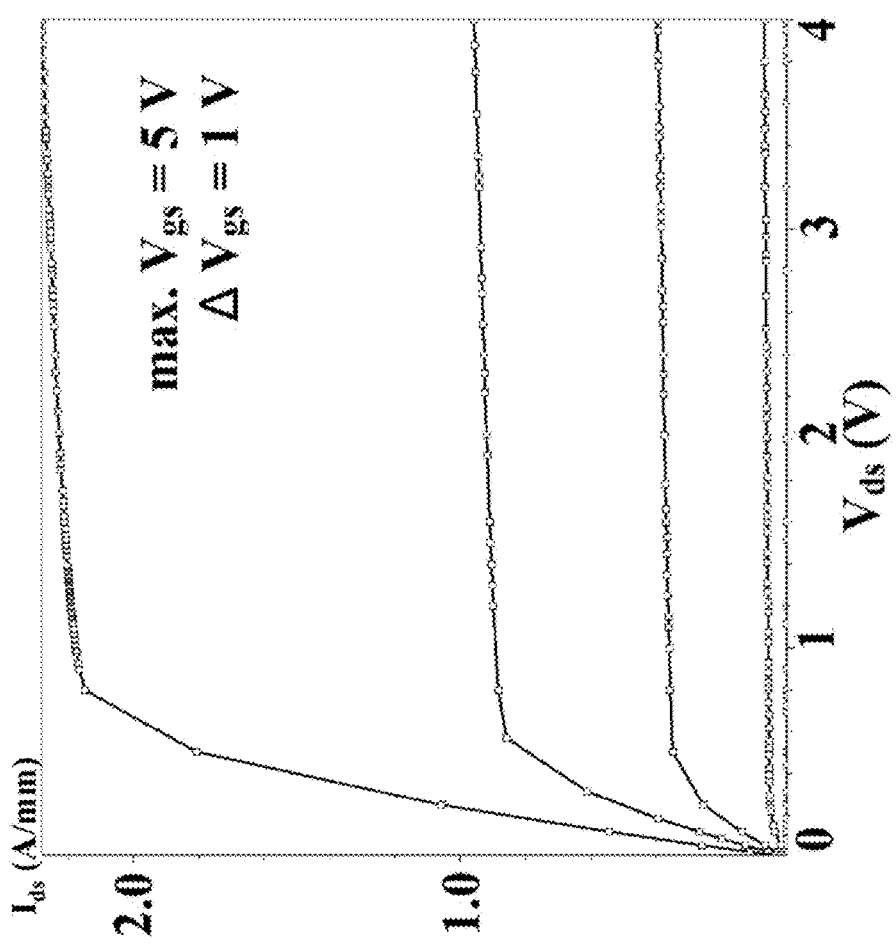

The 2DEG channel current component enhancement can also be done by vertically scaling the GaN layer. The latter method employs a vertically scaled GaN layer which has a smaller resistance in the vertical direction. The scaling strengthen electric field modulation at the bottom interface 278 and therefore leads to higher density of inversion of the 2DEG sheet. Output characteristics in FIG. 5D shows the vertically scaled dual channel HEMT has a 1.25× drive current as the previous dual channel one and 2.71× drive current as the single channel one under the same bias condition.

In some embodiments it is realized that substantial thinning of the gate insulator can worsen the gate leakage and scaling of GaN layer can undermine the channel confinement and introduce unwanted quantum effect. Those embodiments consider trade-off between these two methods when optimize dual channel GaN HEMT device.

For example, in some embodiments, a material of the insulator layer is selected based on a dielectric constant of the material. For example, the material with the high dielectric constant can be selected to increase insulator thickness for breakdown performance improvement while preserving equivalent oxide thickness of the insulator layer for dual channel feasibility. For example, in one embodiment a thickness of the insulator layer is selected such that a minimum voltage sufficient to control the 2DEG channel is also sufficient to create and control the inversion carrier channel.

Some embodiments take advantage of minimizing the thickness of the layers of the stack till optimum thickness avoiding interference between the dual channels. Specifically, the thickness of the N-polar layer can be reduces. Also, the thickness of the insulator layer can be reduced to improve control of the channels while still avoiding the interference. For example, in one embodiment a thickness of the insulator layer is selected in dependence of a voltage applied to the gate during the operation. Specifically, the thickness of the insulator layer can be selected as a proportional function of a dielectric constant of a material of the insulator layer.

Figure 3:
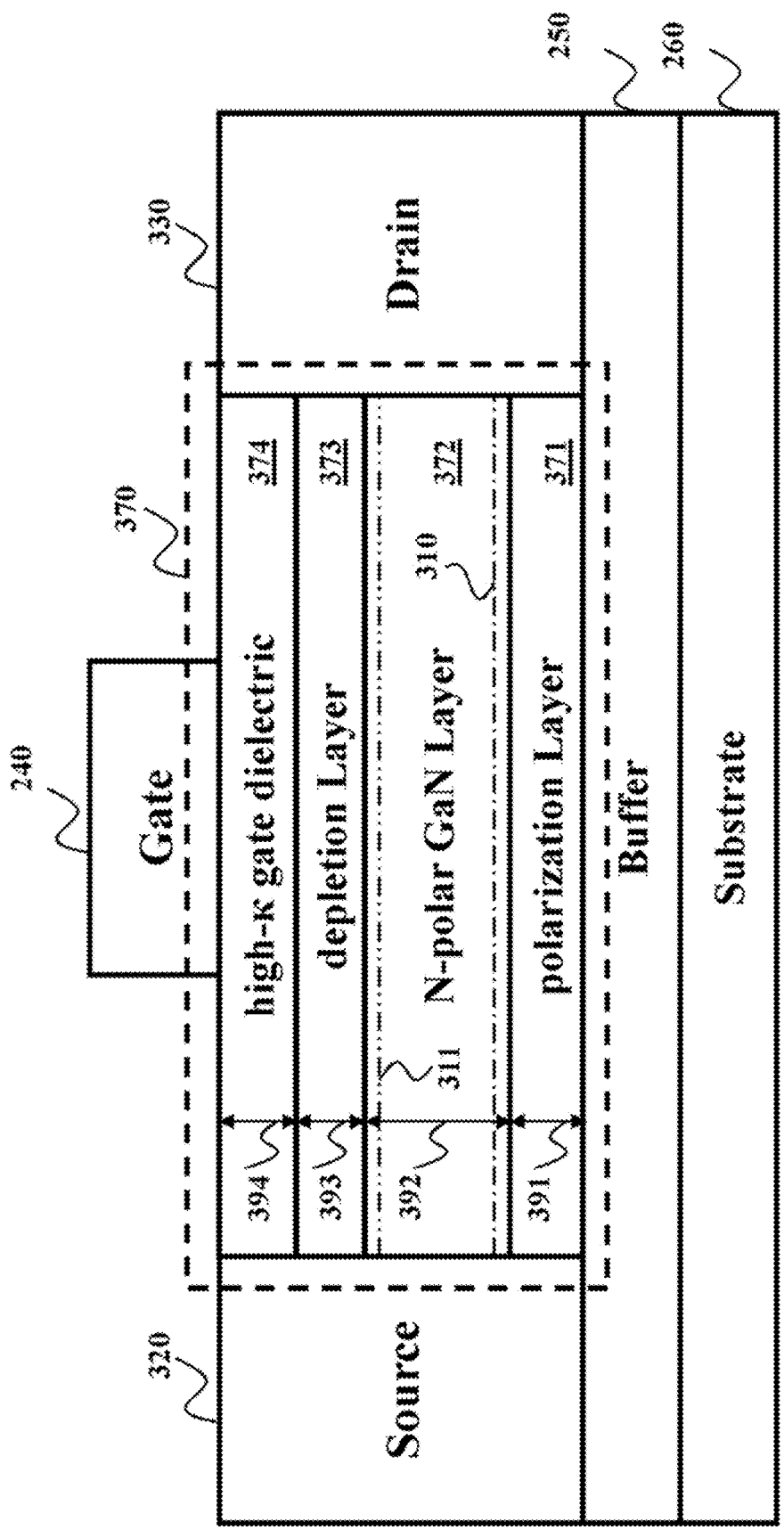
FIG. 3 is a schematic of a single-gate double-channel HEMT with Ga-polar stack on top of N-polar stack according to embodiments of the invention.

FIG. 3 shows an enhanced mode (E-mode) dual-channel MIS-HEMT 300 designed according to one embodiment of the invention. This embodiment is provided for illustration purpose only and is not intended to limit the scope of the invention. A stack 370 includes a first layer 371, which is a polarization layer having an aluminum nitride (AlN) with a wider bandgap and strong polarization. The polarization layer 371 can be maintained as an undoped semiconductor layer and can function as a barrier layer 271. The second layer 372 includes N-polar gallium nitride (GaN) is deposited on the layer 371. The layer 372, which functions as N-polar layer 272, can be unintentionally doped at a level less than $1 \times 10^{15}$ cm-3. In one embodiment thickness 392 of the layer 372 is set as 20 nm. The layers 371 and 372 form a heterostructure for generation of the 2DEG channel.

A layer 373 is a depletion layer includes AlN is deposited on top of the layer 372. The layer 373 is typically thin and is remained undoped. The purpose of this layer is to deplete the 2DEG underneath the gate when no bias is applied to the device and enable the E-mode operation. The fourth layer 374 is a dielectric layer that can, e.g., include of silicon nitride (SiN), and is formed on the top of the surface AlN layer 373. This layer serves as a passivation layer to reduce current dispersion in GaN HEMT and improve device power performance. The layer 373 along with the layer 374 is made thin enough to allow the surface inversion carrier channel development as the positive gate bias applied. In various embodiments, the layer 374 includes high-k material, which further allows reducing the thickness of that layer. In one embodiment, the thickness 393 of the layer 373 is 2 nm, the thickness 391 of the layer 371 and the thickness 394 of the layer 374 is 1 nm. In one variation, an atomic layer deposition is used to eliminate the gate leakage.

In the N-polar GaN layer 372, in addition to the 2DEG channel 310 close to the interface of heterojunction, the induced inversion carrier channel 311 contributes to the device on-resistance reduction. The HEMT further comprises a heavily doped source and drain layer, 320 and 330 respectively. Both layers are heavily doped with a concentration above $1\times10^{19}$ cm-3. This can be achieved either by selective silicon implantation, because the activation yield of N-polar GaN is higher than the Ga-polar one, or by source/drain molecular beam epitaxy (MBE) regrowth technology. Non-alloyed ohmic contact can be made on heavily doped source/drain layer to further reduce the access layer resistance from the contact electrode to the dual channels. Thus in one embodiment, the source and the drain form ohmic contact with the stack.

Figure 4A:
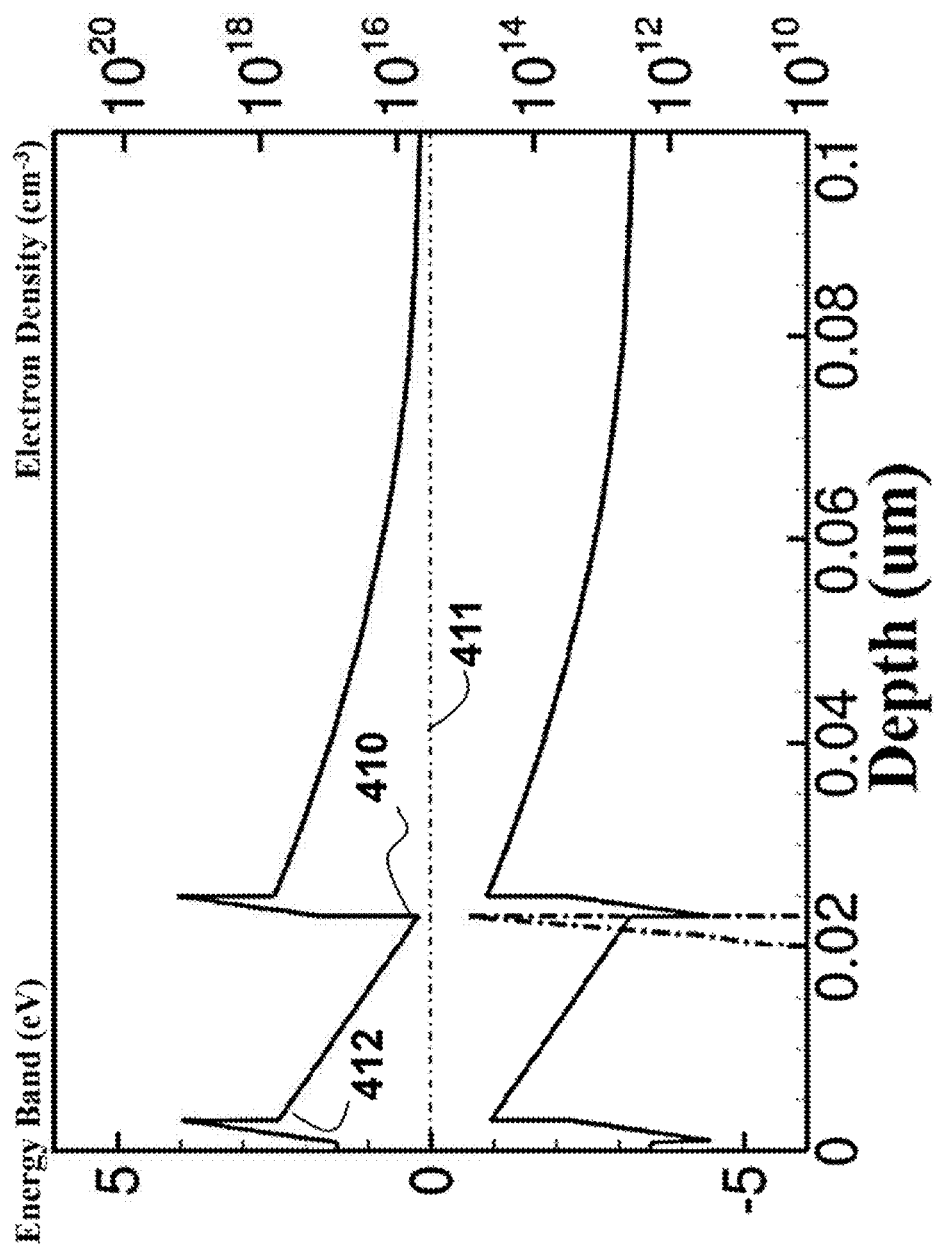

FIG. 4A shows band diagrams of the E-mode dual-channel HEMT device 300, wherein the 2DEG is depleted beneath the gate layer at zero bias using the layer 373. The layer 373 depletes the induced 2DEG 310 by the buried polarization barrier layer. In terms of band diagram, this layer 373 functions to lift the quantum well 410 away from the Fermi level 411 to avoid accumulation of electrons which leads to the channel formation.

Figure 4B:
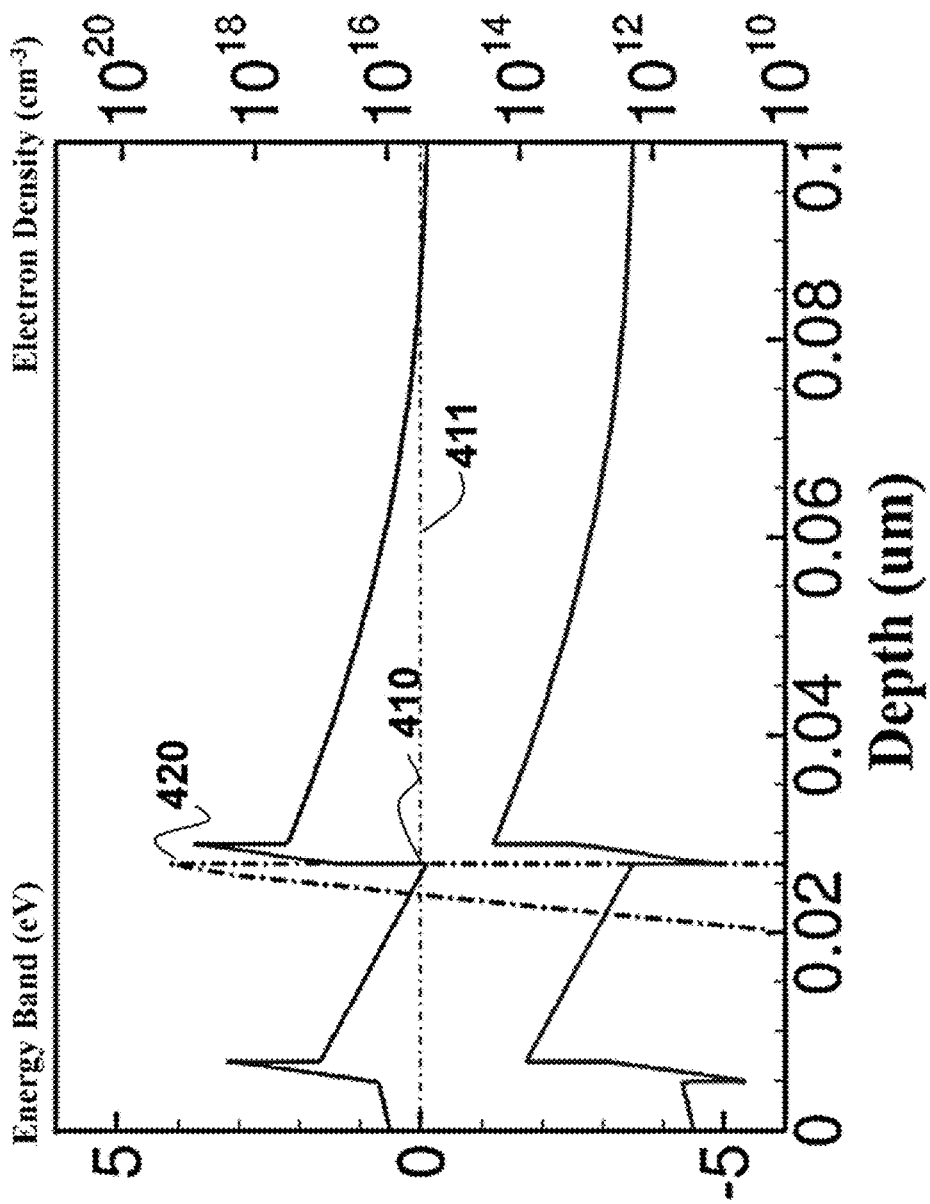

FIG. 4B shows an increase in the bias of the gate in this case, the quantum well approaches the Fermi level to have 2DEG sheet with a high density 420 (more than $1\times10^{12}$ cm$^{-2}$).

As the applied gate bias further increases, the quantum well nears and then enters into the Fermi level. However, the further movement of the quantum well is limited when the 2DEG sheet density almost reaches the physics limit. Thus, the optimized epi-lay stricture 370 of the deuce 300 with a thin gate dielectric insulator layer (373 and 374) permits the gate electric field modulation on surface band.

Figure 4C:
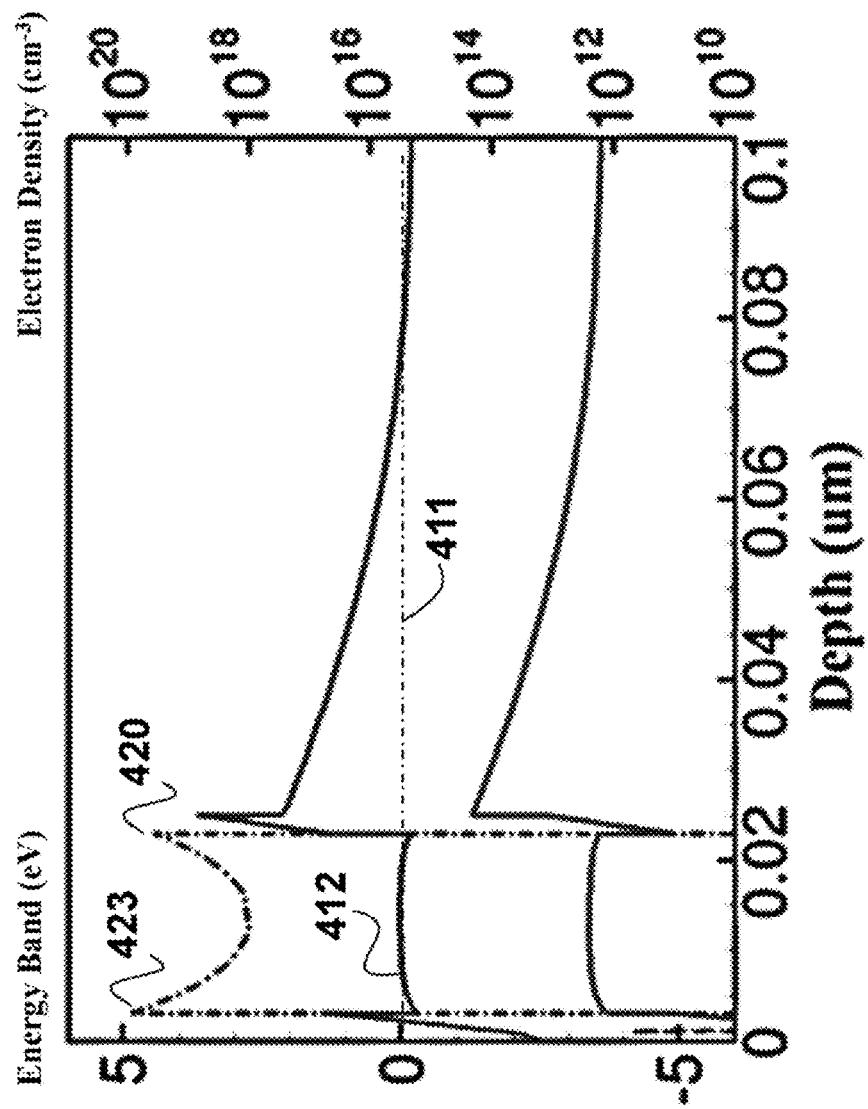

FIG. 4C shows the GaN surface conduction band 412 bending due to the strong vertical electric field from the applied gate bias. This bending process is similar to the metal-oxide-semiconductor field effect transistor (MOSFET) surface inversion layer formation. As a positive enough voltage is applied, negative charge is built up in the GaN layer close to the surface interface. Initially this charge is due to the depletion of the semiconductor starting from the insulator-semiconductor interface. The depletion layer width further increases with increasing gate voltage, but is limited by the thickness of GaN layer. With further increase of the gate voltage, the surface conduction band 412 is bending towards the Fermi level at the interface which is consistent with the presence of a high density of electrons 423. For N-polar GaN HEMT, this surface inversion carrier channel is separated from the 2DEG channel that is close to the bottom interface as illustrated in FIG. 4C, other than having possible electron sheet overlap which may increase the scattering and reduced the carrier mobility for Ga-polar device.

Figure 6:
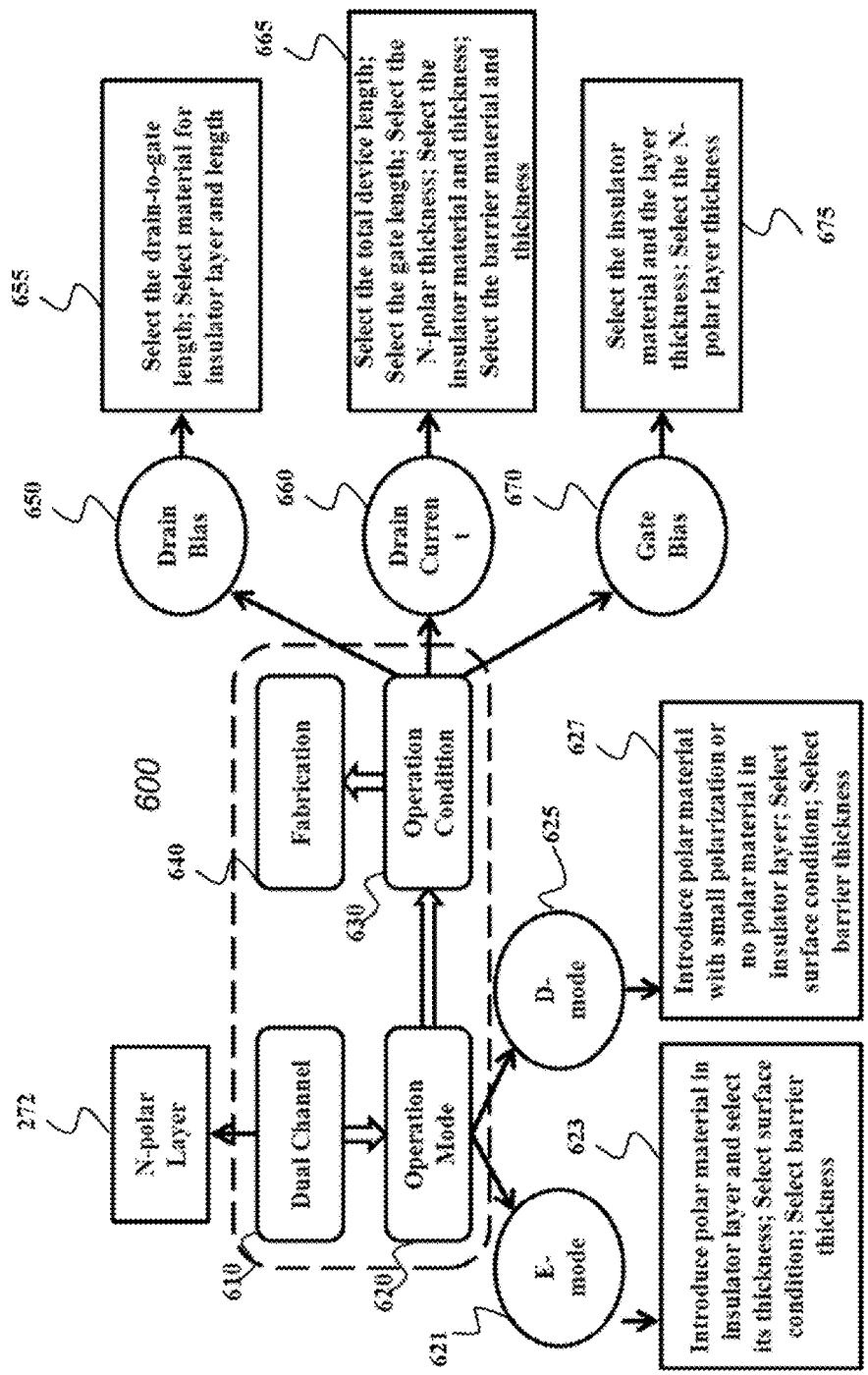
FIG. 6 is a block diagram of a method for designing dual channel HEMT device according to embodiments of the invention.

FIG. 6 shows a method 600 for designing the dual channel HEMT as described above. After the HEMT, the HEMT can be fabricated 640 accordingly. The specification of the N-polar layer 272 is selected at step 610. In the device operation mode step 620, polarization material, thickness for both insulator layer 273 and barrier layer 271 are determined 623 and 627 in dependence of the mode 623 or 625 of the device. Some embodiments also determine surface condition of the layers including traps and fixed charges for threshold voltage tuning.

During the operation condition step 630, the drain bias specification 650 is determined 655 including, but not limiting to, the selection of the drain-to-gate length, insulator layer length and insulator material.

To breakdown voltage enhancement, the drain current specification 660 is determined 665 including, but not limiting to, the selection of the total length of the device, the length of the gate, the N-polar thickness, material and thickness of the insulator and the barrier.

The gate bias specification 670 is determined 675 including, but not limiting to, the selection of the insulator material and thickness of the insulator thickness. As discussed above, the trade-off among the device performance specification need to be made when making the selection of the device components. Some steps of the method 600 are determined using a processor.

For example, in one embodiment a thickness of the insulator layer is selected in dependence of a voltage applied to the gate during the operation in other words, the insulator layer can be related to the threshold voltage, which set the range of the gate voltage for the operation.

The physics for the inversion carrier channel development and bottom 2DEG channel generation are different, despite the fact that channels are created in the same layer. The threshold voltage for the 2DEG component can be tuned by the process techniques and experiences only at the state of the art. To induce sufficient inversion carrier, one embodiment induce the gate bias to reach the threshold voltage $V_T$, which is defined as $$V_T = \phi_{ms} - \frac{Q_f}{C_i} + 2\psi_B + \frac{\sqrt{4\epsilon_s q N_A \psi_B}}{C_i},$$

wherein, $\Phi_{ms}$ is a work-function difference between the gate and the GaN, $Q_f$ is a fixed charge in the insulator layer, $C_i$ is the total capacitance of the insulator dielectrics. $\Psi_B$ is an intrinsic variable determined by the GaN material, $N_A$ is considered to be the value of net polarization charge density at the interface between the GaN layer surface and the dielectric layer. When certain, gate dielectrics and gate material are selected, values of $N_A$, $\Psi_B$ and $\Phi_{ms}$ are fixed, and then the tuning task is up to the growth thickness and quality of the gate insulator.

In some embodiments, a thickness of the insulator layer is a proportional function of a dielectric, constant of a material of the insulator layer. For example, a small capacitance by a large gate insulator thickness or a low dielectric constant material, or negative interface charge introduced by the process require a large applied gate bias for dual channel formation. On the other hand, an increase in metal-insulator-semiconductor capacitance or an increase in amount of positive charge can lead to the early development of the inversion carrier channel than the 2DEG, which in turn can affect the E-mode operation and cause unwanted leakage consumption.

To further improve the drive current, vertically scaling and optimization of GaN layer thickness are considered by some embodiments. With reduce of the GaN layer thickness shrinks, the surface inversion carrier density is not much affected, but the 2DEG density increases due to a stronger electrical field imposed by gate bias due to the reduce distance between the 2DEG and the gate electrode.

Figure 4D:
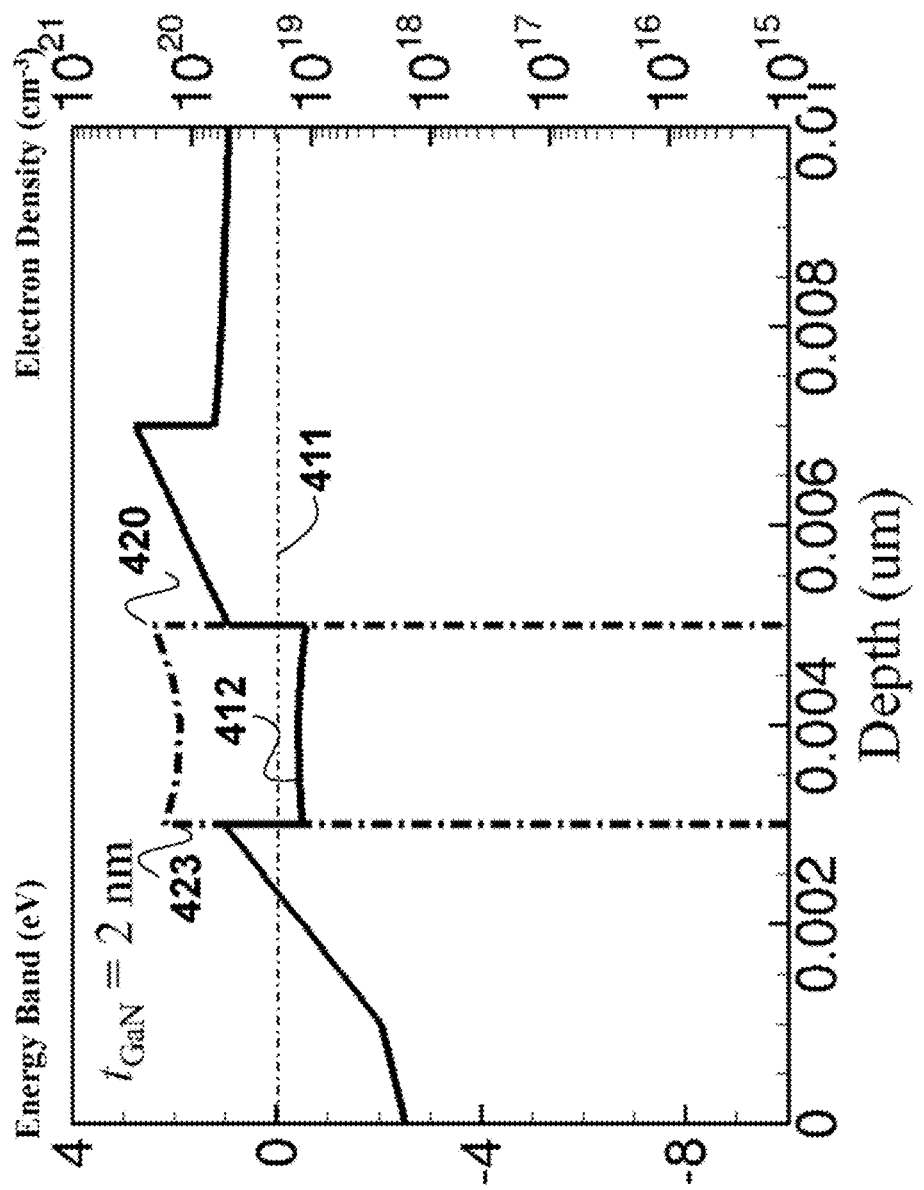
Figure 5E:
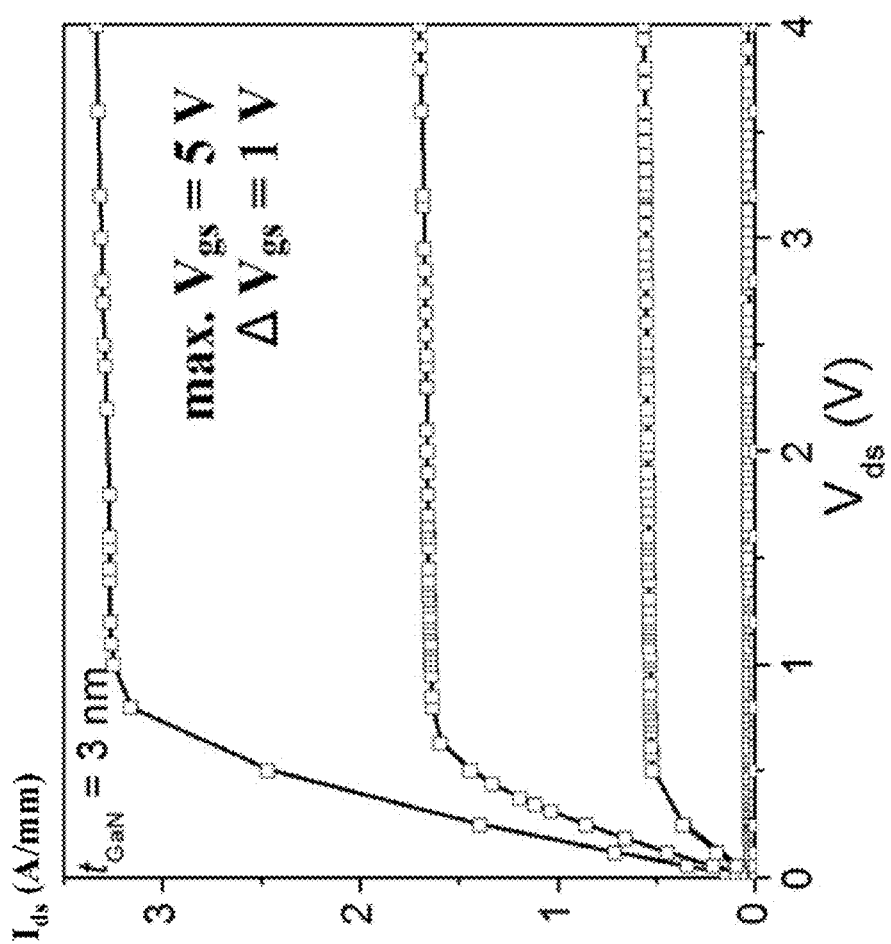

FIG. 5E shows improved output characteristics or embodiment having the GaN layer thickness scaled down to 3 nm. The maximum normalized current reaches 3.34 A/mm. This enhancement also benefits from the double heterojunction structure, the N-polar GaN layer and the layer scaling, which help to minimize the 2DEG channel overlap and reduce the carrier-to-carrier scattering. However, as GaN layer is reduced to 2 nm, the output characteristics start to degrade. The significant channel overlap as shown in FIG. 4D results in the decrease of the mobility and therefore put a restriction on the drive current as shown in FIG. 5F where very thin GaN layer yields little improvement in output characteristics.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A device, comprising:
   a source for transmitting an electronic charge through a conduction path;
   a drain for receiving the electronic charge;
   a stack for providing at least part of the conduction path; and
   a gate operatively connected to the stack for controlling a conduction of the electronic charge, wherein
   the stack includes an insulator layer, an N-polar layer and a barrier layer selected such that, during an operation of the device, the conduction path formed in the N-polar layer includes a two-dimensional electron gas (2DEG) channel and an inversion carrier channel.

2. The device of claim 1, wherein the 2DEG channel is formed by the N-polar layer and the barrier layer due to a heterojunction, and the inversion carrier channel is formed by the insulator layer and N-polar layer due to capacitive relationship between the gate and the N-polar layer.

3. The device of claim further comprising:
   a buffer deposited on a substrate, such that the insulator layer is deposited upon the N-polar layer, the N-polar layer is deposited upon the barrier layer, and the harrier layer is deposited upon the buffer.

4. The device of claim 1, wherein the barrier layer includes a polarization layer, the N-polar layer includes an N-polar gallium nitride (GaN), and the insulator layer includes a dielectric layer deposited upon a depletion layer.

5. The device of claim 4, wherein the polarization layer is undoped, and the N-polar layer is unintentionally doped, such that the polarization layer and the N-polar layer form a heterostructure for generation of the 2DEG channel.

6. The device of claim 4, wherein the depletion layer depletes the 2DEG channel underneath the gate when no bias is applied to the device, such that an enhanced mode operation of the device is enabled.

7. The device of claim 4, wherein the dielectric layer serves as a passivation layer to reduce dispersion of the electronic charge.

8. The device of claim 1, further comprising:
   a source-to-gate region; and
   a drain-to-gate region, wherein an ultra shallow doping is applied to surfaces of the source-to-gate and the drain-to-gale regions to form at least a portion of the conduction path for the inversion carrier channel.

9. The device of claim 1, wherein a thickness of the insulator layer is selected in dependence of a voltage applied to the gate during the operation.

10. The device of claim 1, wherein a thickness of the insulator layer is a proportional function of a dielectric constant of a material of the insulator layer.

11. The device of claim 1, wherein a thickness of the insulator layer is selected such that a minimum voltage sufficient to control the 2DEG channel is also sufficient to create and control the inversion carrier channel.

12. The device of claim 1, wherein the N-polar layer includes a polarized Nitride material selected from a group consisting of a gallium nitride (GaN), an aluminum nitride (AlN), and an aluminum gallium nitride (AlGaN).

13. The device of claim 1, wherein the N-polar layer includes a gallium nitride (GaN).

14. The device of claim 1, wherein the insulator layer includes high-κ material.

15. The device of claim 1, wherein a thickness of the insulation layer and a thickness of the N-polar layer are selected jointly such that a thickness of the device is minimize while avoiding interference between the 2DEG channel and the inversion carrier channel.

16. A high electron mobility transistor (HEMT), comprising:
   a source for transmitting an electronic charge through a conduction path;
   a drain for receiving, the electronic charge;
   a stack for providing at least part of the conduction path; and
   a gate operatively connected to the stack for controlling a conduction of the electronic charge, wherein
   the stack includes an insulator layer, an N-polar layer and a barrier layer selected such that during an operation of the device a two-dimensional electron gas (2DEG) channel is formed by the N-polar layer and the harrier layer due to a heterojunction, and an inversion carrier channel is formed by the insulator layer and N-polar layer due to capacitive relationship between the gate and the N-polar layer.

17. A method for transmitting an electronic charge from a source to a drain through a conduction path of a stack, comprising
   controlling a conduction of the electronic charge using a gate operatively connected to the stack to form at least part of the conduction path including a two-dimensional electron gas (2DEG) channel and an inversion carrier channel.

18. The method of claim 17, wherein the stack includes an insulator layer, an N-polar layer and a barrier layer selected such that the inversion carrier channel and the 2DEG channel are formed in the N-polar layer.

* * * * *